United States Patent [19]
Reddy et al.

[11] Patent Number: 5,792,677
[45] Date of Patent: Aug. 11, 1998

[54] EMBEDDED METAL PLANES FOR THERMAL MANAGEMENT

[75] Inventors: Prathap Amerwai Reddy; Vivek Amir Jairazbhoy, both of Farmington Hills; Robert Edward Belke, Jr., West Bloomfield, all of Mich.

[73] Assignee: Ford Motor Company, Dearborn, Mich.

[21] Appl. No.: 784,701

[22] Filed: Jan. 16, 1997

[51] Int. Cl.$^6$ ............ H01L 21/44; H01L 21/48; H01L 21/50

[52] U.S. Cl. ............ 438/122; 257/720; 257/712; 257/713; 257/717

[58] Field of Search ............ 438/122, 413; 257/720, 712, 713, 717

[56] References Cited

U.S. PATENT DOCUMENTS

| | | | |
|---|---|---|---|
| 3,965,277 | 6/1976 | Guditz et al. | 427/43 |
| 4,150,177 | 4/1979 | Guditz et al. | 427/259 |
| 4,209,799 | 6/1980 | Schierz et al. | 357/81 |
| 4,372,996 | 2/1983 | Guditz et al. | 427/328 |
| 4,680,617 | 7/1987 | Ross | 357/72 |
| 4,872,825 | 10/1989 | Ross | 425/117 |
| 5,050,038 | 9/1991 | Malaurie et al. | 361/386 |
| 5,332,695 | 7/1994 | Shigihara et al. | 438/122 |
| 5,563,773 | 10/1996 | Katsumata | 361/764 |
| 5,650,662 | 7/1997 | Edwards et al. | 257/700 |

*Primary Examiner*—John Niebling
*Assistant Examiner*—David Zarneke
*Attorney, Agent, or Firm*—Leslie C. Hodges; Roger L. May

[57] ABSTRACT

In order to dissipate heat from an electronic device, there is disclosed a method whereby with the use of metal planes embedded in an insulating substrate, heat generated by the electronic device can be transported and dissipated to a remote, more desirable location.

9 Claims, 2 Drawing Sheets

EMBEDDED METAL PLANES FOR THERMAL MANAGEMENT

TECHNICAL FIELD

This invention is related to cooling of electronic components and, in particular, thermal management of integrated electronic components.

BACKGROUND

The concept of integrated packaging relates in essence to a method whereby discrete modules can be interconnected. In certain instances, the packaging for multiple modules can be merged and used more efficiently to produce one or more modules which when combined require less packaging space and utilize a simpler design for ease of maintenance, without compromising the function and efficiency of the module.

In general, electronic components require cooling or heat transport to prevent thermal stresses from adversely effecting the components and/or to increase reliability. Current technology for cooling electronics often uses in combination various heat transport mechanisms. Such heat transport mechanisms include, but are not limited to conduction, natural convection or radiation. In many cases, the use of conduction, natural convection or radiation alone are incapable of dissipating the heat generated by the components to be cooled. As a result, blowers or fans may be required to produce forced convection to cool a particular module. However, it becomes impractical to have an individual heat transport mechanism, such as a fan or blower, for each module which requires cooling. Thermal management of components is thus a limiting factor in determining how multiple modules can be integrated.

The issue of thermal management continues to increase as demand for electronic components rises. For example, in an automobile, with the advent of electronic steering control, electronic air bag diagnostic equipment, and navigational instrumentation, to mention a few, the demand for electronic components has rapidly increased and thus so has the need for thermal management of these electronic components.

One specific problem in the field of thermal management is associated with delamination due to thermal mismatch. In the prior art, metal conductors were laminated on plastic surfaces for electrical connection. These metal conductors were not intended and did not serve as a heat transfer medium. These prior art laminated metal conductors, located on the surface of a plastic material, experienced delamination when subjected to temperature cycling. Since plastic is a poor thermal conductor, when the metal conductor is subjected to high current, the plastic-to-metal interface becomes extremely hot. Accordingly, delamination occurs due to the thermal mismatch between the plastic material and the metal conductor. If a surface mounted electrical conductor experiences delamination, there are several safety concerns associated therewith. In addition, the surface of the plastic material may warp and deform due to the differences in thermal expansion of the two materials. Should the plastic substrate surrounding a surface mounted electrical conductor soften, the warping effect of the plastic substrate will also impact the surface cosmetics of the substrate. Further, the structural integrity of the substrate may be compromised.

Prior art electronic packaging arrangements, have failed to focus on thermal management of integrated devices. Rather, the focus has heretofore been on thermal management of an individual and discrete microelectronic die. As an example, U.S. Pat. No. 4,872,825 issued to Ross relates to a method of encapsulating a microelectronic die. With this invention, the electronic packaging is directed to the microelectronic die and any circuitry attached thereto. Accordingly, in this invention, the chips are encapsulated, keeping the pads open for interconnection and accessible to thermal planes for heat dissipation of the individual die.

There is, however, no recognition in the prior art of the need to integrate electronic devices, while providing a viable heat transport mechanism. There is further a need to maximize the efficiency of electronic packaging, in an effort to reduce the packaging space required for electronic components, while maximizing the efficiency and structural integrity of the electronic components, including thermal management.

SUMMARY OF THE INVENTION

The invention is a method of thermal management of heat-generating electronic devices including the use of embedded metal planes as heat sinks to transfer heat from electronic devices. These embedded metal planes, are useful when the power-generating electronic devices are mounted on the surface of an insulating substrate such as a plastic material. In one embodiment, thermal connection between the electronic devices and the embedded metal planes is established through thermally conductive vias.

With the use of embedded metal planes, the packaging space required for electronic components decreases significantly, as does the flexibility in the arrangement of the electronic packaging. The embedded metal planes thus allow heat from the electronic devices to be transported through the metal planes to a centralized and remote location, which is better suited for heat disposal and/or cooling by conventional means. As a result of the metal planes, the electronic devices can be packaged to achieve optimum space utilization, and a cooling mechanism for a multitude of electronic devices can be placed in a remote location to further maximize packaging space.

A further advantage of this embedded metal plane configuration is that even if the substrate surrounding the metal plane softens or experiences any related degradation at the plastic-to-metal interface, previous problems with delamination, structural integrity and surface deformities will be minimized.

Accordingly, this invention provides a method for thermal management of heat-generating electronic devices, including embedding at least one metal plane, each metal plane having a first and second portion, in an insulating substrate, wherein the insulating substrate has an aesthetic and structural function, to form an embedded substrate. Each electronic device is connected to the first portion of one of the at least one metal planes. A heat sink can be attached to the second portion of the at least one metal plane, wherein the second portion of the at least one metal plane extends outwardly from the insulating substrate, to dissipate heat transported to the at least one metal plane from the electronic devices.

In an alternate embodiment, an integrated instrument panel designed for thermal management is disclosed, including an insulating instrument panel substrate and at least one electronic device, each electronic device having a mounting surface by which each electronic device is mounted on the instrument panel substrate. There is further at least one metal plane, each metal plane having a first and second portion, embedded in the instrument panel substrate such that the first portion of each metal plane is connected to one of the at least one electronic devices. In addition, a heat sink is connected to the second portion of the at least one metal plane, wherein this second portion extends outwardly from the insulating substrate, to dissipate the heat transported to the at least one metal plane by the at least one electronic device.

In yet another embodiment, a method is described for thermal management of heat-generating electronic devices, including, mounting at least one electronic device on an insulating substrate, wherein the insulating substrate has an aesthetic and structural function. At least one metal plane, having a first and second portion, is embedded in the substrate to form an embedded substrate. Each of the electronic devices are then connected to the first portion of one of the at least one metal plane through at least one thermally conductive via, located in the embedded substrate. Thereafter, the second portion of the at least one metal plane is attached to a heat sink to provide for heat dissipation of the heat transported to the at least one metal plane by the electronic devices.

As an example of the benefits associated with this invention, take, for example, an instrument panel of an automobile, wherein the electronic devices including power devices can be mounted on the plastic substrate. With an integrated panel, electronic devices can be directly mounted onto the plastic substrate, which eliminates circuit board housing and provides for more efficient utilization of the plastic panels located throughout the instrument panel. In contrast, with the previous arrangement, each electronic device or module was discrete and isolated, and as a result, connectors were required for interconnection between the modules. In addition, plastic surrounding the electronic components was not properly utilized. As a result of the integration process and this invention, modules can be combined, removing the need for the multitude of connectors, and with the use of metal planes embedded in the plastic, heat can be effectively transported and managed in a remote, more suitable location using the plastic as a substrate and means for heat transport. Due to this invention, there are more options available as far as electronic packaging, since a cooling mechanism is not required for each distinct module, and the cooling mechanism can be placed in a location more suitable from a packaging standpoint.

One object of the invention is to provide heat dissipation means for integrated electronic components.

Another object of the invention is to allow for thermal management of electronic components using thermal planes, and thereby facilitate a remote cooling mechanism.

Still another object of the invention is to use embedded metal planes as heat sinks, whereby electronic components can be mounted directly onto a metallized plastic substrate with embedded metal planes and heat generated from the components can be stored and then dissipated through the embedded metal planes in the plastic substrate.

Yet another object of the invention is a method for thermal management of electronic components for an integrated instrument panel for a vehicle.

These and other objects will become more apparent from a detailed reading of the specification in conjunction with the attached drawings.

BEST MODE FOR CARRYING OUT THE INVENTION

In the current invention, embedded metal planes are used as heat sinks to transfer heat from electronic devices mounted on an insulating substrate, preferably a polymeric material such as plastic.

Figure 1A:
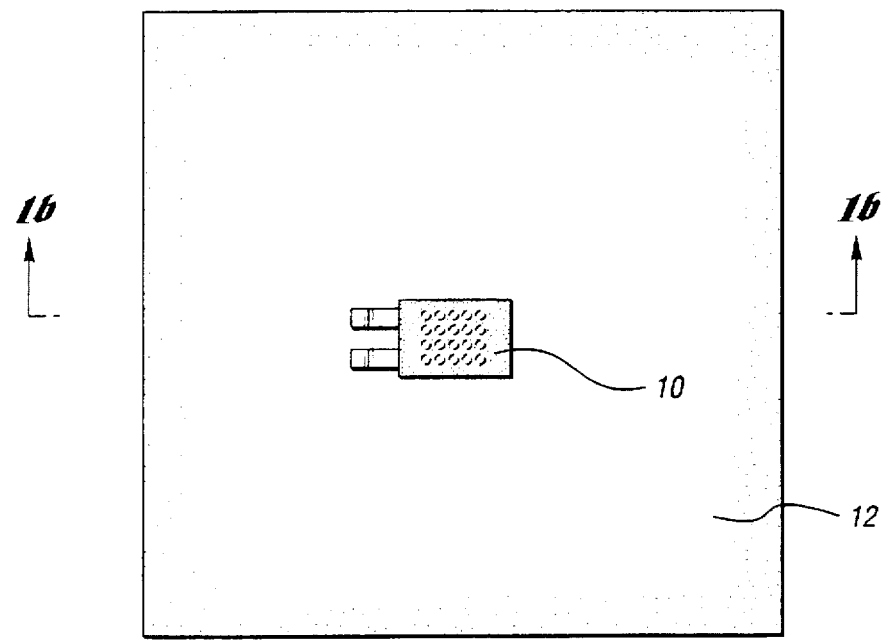
FIG. 1a is a top perspective view of an electronic device mounted on a substrate.

FIG. 1a is a perspective view of a first embodiment of the invention including an electronic device 10 mounted on the surface of an insulating substrate 12, preferably a polymeric material such as plastic. The electronic device 10 is intended to be any electronic device which generates heat and thus requires cooling, such as a diode, resistor, transistor, semiconductor device or the like. For purposes of this invention, the insulating substrate 12 is intended to have an aesthetic and structural function. Accordingly, in an automobile, for example, the insulating substrate could include the instrument panel, center console, side arm rests or any other polymeric component which serves to aesthetically house electronic devices while providing structural support to the same electronic devices. Likewise, a substrate which serves as an insulator while providing an aesthetic and supportive housing for electronic devices—for any application—constitutes an insulting substrate as defined herein. By mounting the electronic device directly on such an insulating substrate, the circuit board housing can be eliminated and thus the term "insulating substrate" is intended to exclude a circuit board housing.

Figure 1B:
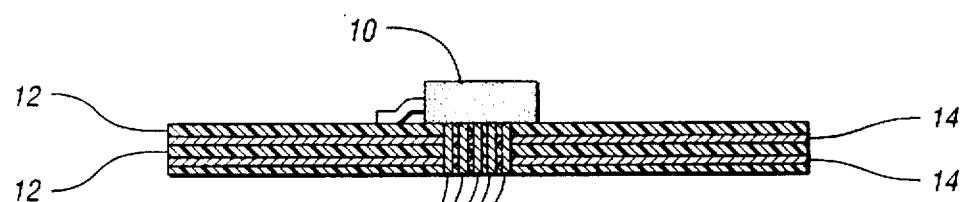
FIG. 1b is a cross-sectional view of the embodiment of FIG. 1a taken along section line 1b—1b.

Turning now to FIG. 1b, a cross-sectional view, taken along Lines 1b—1b of FIG. 1a, there is shown two metal planes 14 embedded in the insulating substrate 12. The metal planes are preferably constructed of a highly conductive material, such as silver, aluminum copper or the like. With the use of a thermally conductive material, the metal plane itself serves not only as heat-carrier, but as a heat sink. As illustrated by FIG. 1b, the metal planes are solid throughout and preferably have a diameter or a minimum thickness of 10 mil.

In FIG. 1b, there is further shown a series of thermally conductive vias 16, which as depicted therein, connect the electronic device 10 to a metal plane 14 to establish a thermal connection therebetween. As a result of the combination of the metal planes 14 and the thermally conductive vias 16, heat generated from the electronic devices can be transported through the thermally conductive vias 16, to the metal plane 14 and dissipated in a remote location. For transient applications, the metal planes 14 themselves can be sufficient to dissipate the heat generated by an electronic device. The insulating substrate 12 thus serves as a base for the electronic devices 10 and moreover serves as an insulating layer between the metal planes to prevent shorting of the electronic devices. The metal planes 16 can of course also serve as electrical conductors, carrying current from the electronic device. In this case, the thermally conductive vias 16 also serve as electrical conductors.

The thermally conductive vias 16, as well as the metal planes 14, are embedded within the insulating substrate 12 to prevent problems associated with thermal mismatch and warpage. If a thermally conductive via or metal plane is surface mounted, any warpage could cause reliability issues and affect the cosmetic appearance of the substrate's surface. In contrast, by embedding the thermally conductive vias 16 and the metal planes 14, should any warpage result from thermal mismatch, the warpage would be minimal as a result of the balance of forces on either side of the metal planes by the insulating substrate. In addition, reliability of the electronic device 10 is expected to be better because the thermal stress placed on the electronic device is reduced due to the ability of the thermally conductive vias 16 and/or the metal planes 14 to effectively draw heat away from the electronic device and into the insulating substrate.

The thermally conductive vias 16 are preferably constructed from a highly conductive material, similar to that used for the metal planes, and thus, copper is the most preferred material. As illustrated by FIG. 1b, the thermally conductive vias 16 are tubular in construction and thus include an aperture in the center and have a typical thickness of 0.5–5 mil. In the preferred embodiment, the thermally conductive vias 16 are filled with an epoxy adhesive to prevent solder flux from flowing through the conductive vias, lodging in undesirable places and causing electrical reliability issues. The problem with solder flux has in general diminished, as a result of the design of this invention, wherein the thermally conductive via is not directly connected to a heat sink, but rather a metal plane is positioned therebetween. Nonetheless, to prevent any such problems, it is preferred that the thermally conductive vias 16 are plugged with an epoxy adhesive.

The electronic device 10 is mounted on an insulating substrate 12 in one of two ways, depending on whether the thermally conductive vias 16 are utilized in the heat transport arrangement. As depicted in FIG. 1b, where the electronic device is connected at one end to a series of thermally conductive vias 16, the electronic device is mounted onto the substrate with the use of a conductive pad. The electronic device must be in contact with a conductive surface, such as the conductive pad, so that electrical conductivity is not reduced and the heat generated by the electronic device passes through the pad and into the thermally conductive vias 16. With the use of thermally conductive vias 16, holes are drilled into the conductive pad in the same location and to approximate the size of the holes within the thermally conductive vias. Holes are drilled in the conductive pad, in an effort to facilitate heat flow from the electronic device to the metal plane. The conductive pad is generally constructed of the same material as the thermally conductive vias.

As depicted in FIG. 1b, a series of thermally conductive vias 16 are provided to one electronic device 10. The optimum number of thermally conductive vias 16 to transport heat for a particular electronic device depends on the surface area of the electronic device, the power dissipated by the electronic device pad area and the thermal route whereby the heat is dissipated. The calculation involves determining the minimum number of thermally conductive vias necessary to sufficiently remove heat from the electronic device and prevent thermal stress on the electronic device. Additional thermally conductive vias are then added to increase the additional margin of heat which can be dissipated by the thermally conductive vias, as a safety precaution. As a result, in general, an electronic device requires more than one thermally conductive via for heat transport away from the electronic device, where thermally conductive vias are to be used.

Notably, while a series of thermally conductive vias are provided to the electronic device, each electronic device is connected to a single metal plane. This arrangement is necessary in an effort to prevent shorting of the electronic devices, as each device may require electrical isolation and thus requires its own independent metal plane to avoid shorting of the electronic devices.

As shown in FIG. 1b, electrically distinct metal planes 14 can be positioned parallel to one another. To further maintain the electrical distinctness of the metal planes 14, the thermally conductive vias 16 can make contact with only one metal plane 14. Again, based on the fact that each metal plane 14 is likely to conduct electricity at differing voltages, it is necessary that the thermally conductive vias 16 carrying the thermal energy and possibly electricity, run to a single metal plane 14 and thus prevent shorting of the electronic devices 10.

While the thermally conductive vias 16 are primarily utilized for thermal management of the electronic devices 10, where necessary, they may also serve as a transporter of electricity. Likewise, the metal planes 14 can also be used as electrical conductors carrying current.

Figure 2A:
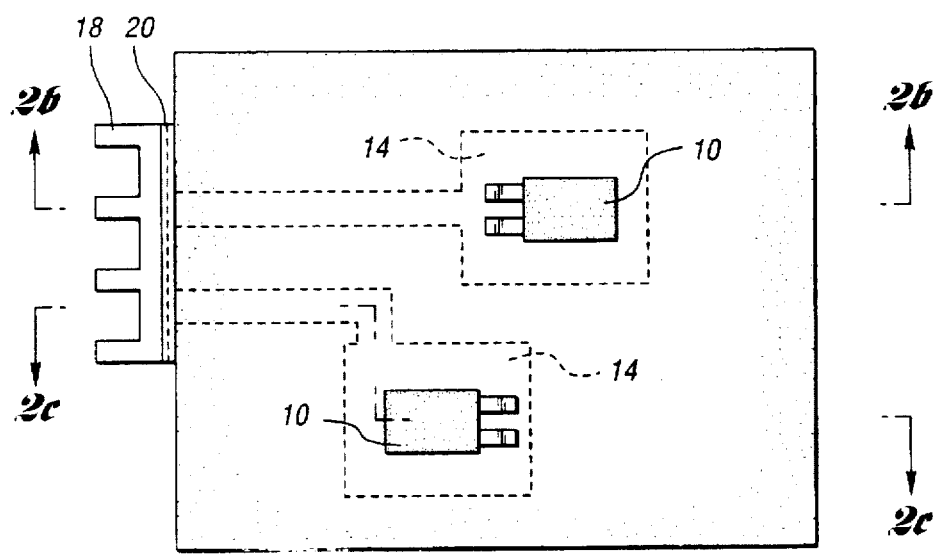
FIG. 2a is a top perspective view of an alternate embodiment of the invention, depicting two devices mounted on a substrate, each device connected to a separate metal plane and each metal plane in turn connected to a single remote heat sink.

As further depicted in FIG. 2a, multiple metal planes can and should be embedded within a single insulating substrate. There should however be a separation of the metal planes 14 at all points along the metal plane, again to keep the varying voltages of each electronic device segregated from one another.

The insulating nature of the substrate material serves as the dielectric between the metal planes and thus a minimum separation between the two metal planes 14 can be calculated based on the substrate 12 thickness, the type of substrate material utilized, and more specifically, the substrate' dielectric properties. In general, a minimum separation of five mils is required at any point along the metal planes to prevent shorting of the connected electronic devices 10. Moreover, there should also be some consideration to the current flowing through the metal planes and how the current affects the conductivity of the insulating substrate.

From a construction standpoint, there are two constraints involved with separation of the metal planes. First, the process for embedding the metal planes, preferably insert molding itself requires a minimum separation so that during the insert molding process, the metal planes do not deform or come into contact with one another. As a result of this processing constraint, a minimum of a ten mil separation is preferred. The larger the separation between the metal planes the more preferred the arrangement is as there is less chance of shorting. However, separation of the metal planes and the location of the metal planes will be determined by the substrate thickness. In general, the substrate thickness is 100–120 mils, with an overall range of 60 mils to 140 mils.

The metal planes are embedded in the substrate through insert molding or any other suitable process. During the insert molding process, it is thus preferred that the metal planes are placed in the mold during the molding process such that the insulating substrate is formed surrounding the metal planes.

Figure 2B:
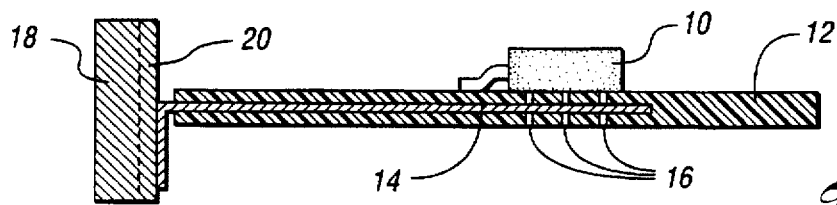
FIG. 2b is a cross-sectional view of the embodiment shown in FIG. 2a taken along section line 2b—2b.
Figure 2C:
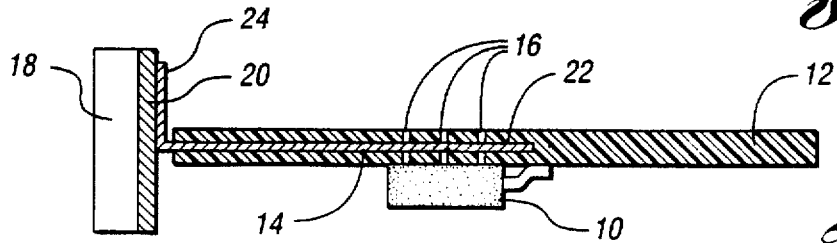
FIG. 2c is a cross-sectional view of the embodiment shown in FIG. 2a taken along section line 2c—2c.

Referring now to FIG. 2a, there is depicted two electronic devices 10 mounted on an insulating substrate 12, wherein the electronic devices 10 are in thermal connection with a heat sink 18 in a remote location. Each device shown in FIG. 2a is mounted on a separate metal plane 14, wherein each metal plane is connected to a single remote heat sink 18, as depicted in FIGS. 2b and 2c. As further depicted in FIG. 2b, each of the metal planes has a first portion 22 and a second portion 24. Each electronic device 10 is thus individually connected to the first portion 22 of one metal plane 14. The second portion 24 of each metal plane is then attached to a heat sink 18 to dissipate heat transported to the metal planes from the electronic devices. As shown in FIG. 2b, the second portion 24 of each metal plane preferably extends outwardly from the insulating substrate and thus this second portion of the metal plane is used for attachment to the heat sink to effectuate heat dissipation. As depicted in FIG. 2a, the heat sink 18 is a finned plate.

As further provided in FIG. 2a, the heat sink is attached to the substrate 12 with the use of a thermally conductive, electrically insulative adhesive 20. With the use of such an adhesive, the adhesive conducts thermal energy while acting as an electrical insulator and thus preventing any electrical problems with the heat sink.

With the use of a thermally conductive electrically insulated adhesive, the adhesive layer ensures electrical distinctness of the metal planes, while providing a thermally conductive surface through which the heat from the metal planes can be dissipated to the heat sink. The adhesive is preferably a metal oxide filled epoxy silicone or acrylic. To enhance the thermal conductivity, the adhesive more preferably includes ceramic fillers such as aluminum oxide and boron nitride.

There is, of course, a significant resistance at the point of adhesion of the heat sink to the metal plane. Although a thermally conductive adhesive is utilized, the difference in conductivity between the metal plane and the adhesive is significant enough to create significant resistance. However, with the use of metal planes, any negative impact of this resistance is significantly minimized because of the separation between the electronic device and the heat sink, created by the metal planes. Thus, should some thermal energy be expelled at the point of contact between the heat sink and the metal plane, at that location, the dissipation of heat will have little to no effect on the functioning of the electronic device.

Notably, with this invention, any number of electronic devices can be mounted on the plastic substrate. The primary constraint with respect to the number of electronic devices capable of being mounted on a single substrate is determined by the available surface area of the substrate, the dielectric properties of the substrate material and efficiency of the thermal management.

Figure 3B:
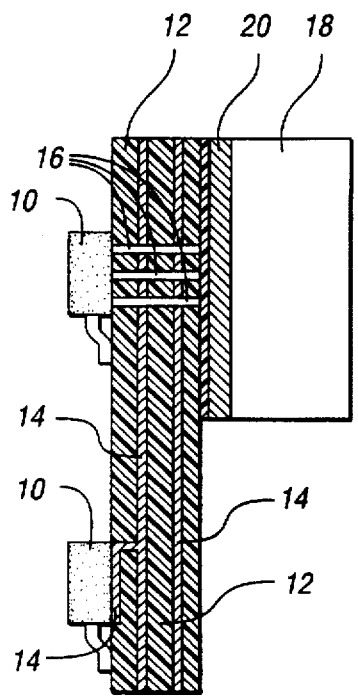
FIG. 3b is a cross-sectional view of the embodiment shown in FIG. 3a taken along section line 3b—3b depicting one of the devices directly mounted on the metal plane.
Figure 3A:
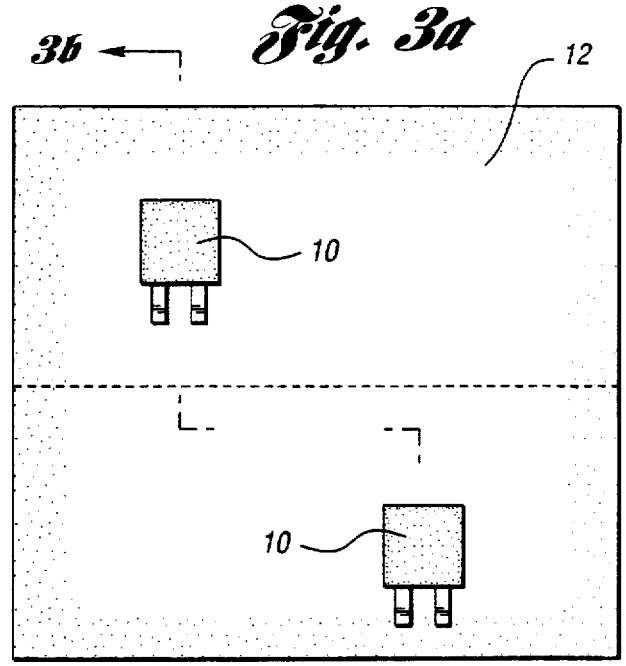
FIG. 3a is a top perspective view of an alternate embodiment of the invention, depicting two devices mounted on a substrate.

In reference to FIG. 3a, there is depicted two electronic devices 10 on an insulating substrate 12.

With reference to FIG. 3b, depicting a cross-sectional view taken along line 3b—3b of FIG. 3a, there is depicted an alternate embodiment of this invention. On one side of FIG. 3b, there is illustrated the first embodiment of this invention wherein an electronic device 10 is mounted on insulating substrate 12, wherein a series of thermally conductive vias 16 are provided in the substrate 12 which are in turn connected to a metal plane. As further depicted in FIG. 3b, a second electronic device is also mounted on an insulating substrate 12, however, with this mounting arrangement, the electronic device 10 is directly mounted onto the metal plane, without the need for the thermally conductive vias 16. As there is some resistance associated with the use of thermally conductive vias 16, due to the small cross-section area of each thermally conductive via, in the most preferred embodiment, where possible, the electronic device 10 would be directly mounted onto a metal plane 14. With this direct mounting arrangement, thermal resistance is thus minimized.

However, in a variety of situations, the electronic device cannot be directly soldered to the metal plane, because the metal plane serves as a heat sink and thus prevents the buildup of heat necessary to permit soldering and thus prevents direct attachment to the metal plane 14. Accordingly, the alternate embodiment, wherein the thermally conductive vias are positioned between the metal plane and the electronic device, facilitating soldering of the device with the use of a conductive pad. The positioning of the metal plane is again achieved preferably with the use of molding and more preferably with the use of insert molding whereby a pre-shaped metal plane is positioned in the substrate during the molding process such that a position of the metal plane is exposed from the substrate for direct of with the electronic device.

Figure 3C:
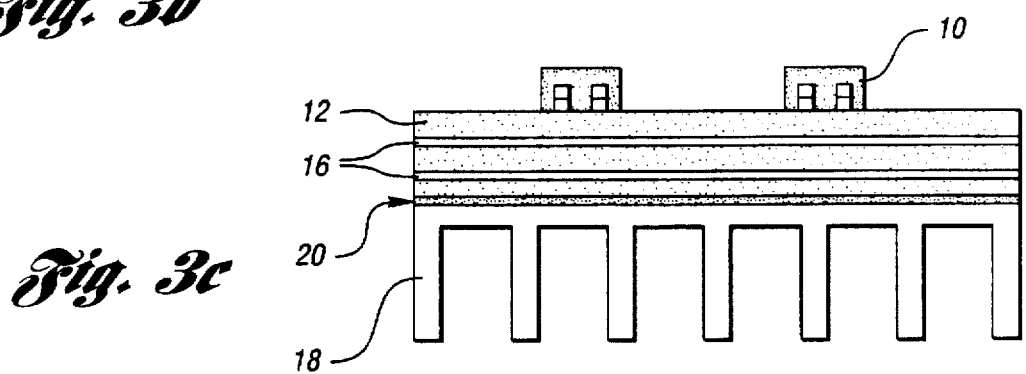
FIG. 3c is a side view of the embodiment shown in FIG. 3a depicting a heat sink.

FIG. 3c further depicts a side perspective view of the electronic devices 10 mounted onto the insulating substrate 12, wherein metal planes 14 are used to dissipate the heat and a thermal adhesive 20 is used to attach a heat sink 18 to the substrate, and more specifically to the metal planes 14.

In even a more preferred embodiment, this invention is utilized to create an integrated instrument panel for vehicles, wherein the instrument panel is designed to achieve thermal management of the electronic devices included therein. These same general principles apply with the use of an integrated instrument panel, wherein there is an insulating instrument panel substrate, preferably plastic, and at least one electronic device having a mounting surface by which the electronic device is mounted onto the instrument panel substrate. There is further at least one metal plane embedded in the instrument panel substrate, wherein each metal plane is thermally connected to an electronic device and there is further a heat sink thermally connected to each of the metal planes to dissipate the heat transported to the metal planes by each of the electronic devices.

Currently, most heat transport applications are conducted by natural convection, in certain situations forced convection may be needed, this is generally the case where the heat load produced by a given electronic device exceeds 50 watts or more. As an example, the variable blower controller in a vehicle, such as the controller for the automatic climate control and, often radios, generate heat loads exceeding 50 watts and thus may require forced convection as a cooling mechanism. Previously, an electronic device would be mounted in the climate control ducting. However, if the heat sink for the electronic device is located in the duct near the intake of the evaporator core of the climate control duct, the performance of the climate control system is substantially affected. Accordingly, the present invention allows the heat sink to be remotely located while the cooled air from the climate control ducting can be effectively utilized. With this invention, the heat can be transported through the substrate by a metal plane to a desirable remote location so that the heat sink in its new location will have little to no effect on the performance of the climate control system and allow integration of the electronic devices.

With this invention, there is thus the ability to utilize the plastic used for electronic packaging of instrument panels as a base substrate for the electronic devices, and further as a medium for heat transport. Moreover, with the use of thermally conductive vias and/or metal planes, the heat generated from an electronic device can be remotely transported to a location more suitable from both a packaging and efficiency standpoint.

While the best mode and viable alternate embodiments for carrying out the invention have been described in detail as shown on the drawings, those familiar in the art to which this invention relates will recognize various alternative designs and embodiments for practicing the invention as defined by the following claims.

What is claimed is:

1. A method for thermal management of heat-generating electronic devices in an automobile, comprising:

providing an electronic device and at least one metal plane, wherein each plane has a first portion and a second portion;

insert molding the at least one metal plane into a polymeric automotive component to form an embedded substrate having aesthetic and structural function in the automobile, wherein the first portion of the at least one metal plane is embedded within the embedded substrate, and wherein each metal plane is spaced apart from and generally parallel with one another;

forming a plurality of thermally conductive vias in the embedded substrate extending from an outer surface thereof to the first portion of one of the at least one metal plane; and mounting the electronic device to the outer surface of the embedded substrate atop the plurality of thermally conductive vias, so as to form a thermal connection between the electronic device and the first portion of one of the at least one metal plane through the plurality of thermally conductive vias.

2. The method of claim 1, wherein the polymeric automotive component is an instrument panel, a center console, or a side arm rest.

3. The method of claim 1, further comprising the step of attaching a heat sink to the second portion of the at least one metal plane, wherein the second portion of the at least one metal plane extends outwardly from the insulating substrate.

4. The method of claim 3, wherein the embedded substrate includes at least two metal planes, and wherein the heat sink is attached to at least two of the at least two metal planes.

5. The method of claim 1, wherein the thermally conductive vias are positioned between the electronic device and the first portion of only one of the at least one metal plane.

6. A method for thermal management of heat-generating electronic devices in an automobile, comprising:

providing an electronic device and at least one metal plane, wherein each plane has a first portion and a second portion, wherein the first portion of at least one of the at least one metal plane has a generally L-shaped mounting portion extending outward therefrom;

insert molding the at least one metal plane into a polymeric automotive component to form an embedded substrate having aesthetic and structural function in the automobile, wherein the first portion of the at least one metal plane is embedded within the embedded substrate with only a top surface of the generally L-shaped mounting portion exposed therefrom, and wherein each metal plane is spaced apart from and generally parallel with one another;

mounting the electronic device to the outer surface of the embedded substrate atop the exposed top surface of the generally L-shaped mounting portion, so as to form a thermal connection between the electronic device and the first portion of one of the at least one metal plane.

7. The method of claim 6, wherein the polymeric automotive component is an instrument panel, a center console, or a side arm rest.

8. The method of claim 6, further comprising the step of attaching a heat sink to the second portion of the at least one metal plane, wherein the second portion of the at least one metal plane extends outwardly from the insulating substrate.

9. The method of claim 8, wherein the embedded substrate includes at least two metal planes, and wherein the heat sink is attached to at least two of the at least two metal planes.

* * * * *